United States Patent
Caywood et al.

[11] Patent Number: 6,096,093
[45] Date of Patent: Aug. 1, 2000

[54] METHOD FOR USING INSPECTION DATA FOR IMPROVING THROUGHPUT OF STEPPER OPERATIONS IN MANUFACTURING OF INTEGRATED CIRCUITS

[75] Inventors: John Caywood, Sunnyvale; David Y Lepejian, Palo Alto, both of Calif.

[73] Assignee: Heuristic Physics Laboratories, San Jose, Calif.

[21] Appl. No.: 08/985,624

[22] Filed: Dec. 5, 1997

[51] Int. Cl.[7] ................................................. G06F 17/50
[52] U.S. Cl. ................................................. 716/21; 716/19
[58] Field of Search ........................... 395/500.22, 500.2, 395/500.05, 500.06; 364/468.28; 716/4, 5, 19, 21

[56] References Cited

U.S. PATENT DOCUMENTS

| | | | |
|---|---|---|---|
| 3,751,647 | 8/1973 | Maeder et al. | 235/151.11 |
| 4,706,019 | 11/1987 | Richardson | 324/158 |
| 5,014,226 | 5/1991 | Horstmann et al. | 395/500.05 |
| 5,030,907 | 7/1991 | Yih et al. | 324/158 |
| 5,475,695 | 12/1995 | Caywood et al. | 371/27 |
| 5,539,652 | 7/1996 | Tegethoff | 364/490 |
| 5,777,901 | 7/1998 | Berezin et al. | 364/578 |
| 5,808,919 | 9/1998 | Preist et al. | 364/579 |
| 5,822,218 | 10/1998 | Moosa et al. | 364/488 |

*Primary Examiner*—Paul R. Lintz
*Assistant Examiner*—Leigh Marie Garbowski
*Attorney, Agent, or Firm*—Sierra Patent Group, Ltd.

[57] ABSTRACT

A method for managing stepper operations required during the manufacturing of an integrated circuit die having at least one known defect, as determined by inspection, comprises the steps of determining, based upon an analysis of the connectivity and defect information relating to the die having at least one known defect a probability of failure to each at least one known defect and eliminating from stepper operations any die having at least one fatal defect.

13 Claims, 2 Drawing Sheets

METHOD FOR USING INSPECTION DATA FOR IMPROVING THROUGHPUT OF STEPPER OPERATIONS IN MANUFACTURING OF INTEGRATED CIRCUITS

BACKGROUND OF THE INVENTION

1. Field of the Invention

This invention relates to the field of integrated circuit manufacturing. More particularly, the present invention describes a method for using manufacturing defect data in order to increase the throughput of integrated circuit manufacturing equipment.

2. Background

Improvements in integrated circuit technology have resulted in the gradual increase in the overall size of individual wafers and the dramatic decrease in the die area required to perform a given function. Thus, greater numbers of more complex circuits are now present on each wafer. For example, the number of bits stored in a leading edge Dynamic Random Access Memory (DRAM) has increased about a thousand times over the past fifteen years.

Due to the high cost of the manufacturing equipment and other equipment used to produce an integrated circuit, it is desirable to maximize the throughput of the manufacturing process so as to amortize the cost of the equipment over the highest number of wafers possible in a given amount of time.

When manufacturing electronic circuits on silicon wafers, it is common to perform all processing, inspection, and test operations on each die within each wafer so that each die is manufactured as nearly identically as possible. As integrated circuit technology has evolved, manufacturing and inspection techniques have been developed for improving the yield of good dice and for identifying the physical origins of failures. For example, inspection stations utilizing automated optical inspection techniques allow inspection of large areas of the wafer simultaneously in order to provide high throughputs which decreases the cost of inspection per layer per wafer.

Typical optical inspection stations are computer controlled and are capable of generating reports on defect density by defect size by process layer inspected for each wafer inspected. This information, together with the location of the defects, is either stored locally at each inspection station, or stored in a large data base. This data is often used with statistical techniques in a statistical process control (SPC) system to provide feedback to manufacturing personnel which might indicate when to perform maintenance operations or when a manufacturing tool is out of statistical control and consequently in need of intervention by a technician.

Not all defects caused during the manufacturing process will cause electrical malfunctions. Whether a particular defect causes a fault depends upon where the defect lies, its size, and whether it is comprised of conducting or non-conducting material.

FIG. 1 is a layout diagram of typical defects which will not result in an electrical failure.

Referring to FIG. 1, conductive paths 10 and 12 represent conducting metal layers that are not designed to be connected together. Regions 14 and 16 represent areas of unintended metal remaining on the wafer after a metal etch processing step. Neither of these regions 14 or 16 cause an unintended connection between paths 10 and 12, and thus are termed "non-fatal" defects. If either of these defects was large enough that paths 10 and 12 were caused to be connected, the region 14 or 16 which connected them would be designated a fatal defect.

The analysis to determine whether defects are fatal can be performed without electrical testing using only geometrical information. However, this will often lead to a false positive identification of fatal defects.

FIG. 2 is a layout diagram depicting defects which cause bridging between traces.

Referring to FIG. 2, conductive paths 20 and 22 represent portions of a metal layer such as the metal-1 or metal-2 layers known to those of ordinary skill in the art. Defects 24 and 26, if comprised of conducting material, have the potential of electrically connecting the two neighboring traces, thus causing one or more "bridging" faults. The determining factor of whether a bridging fault would occur is whether those neighboring traces are designed to be connected at some other location on the die. If the traces are not designed to be connected at any location, a bridging fault exists.

For example, because the two portions 28 and 30 of path 20 are designed to be connected together near the reference designation 20, defect 24 causes a non-fatal defect bridge between portions 28 and 30 of path 20. Because the bridge does not connect two traces that otherwise would not be connected, there is no bridging fault.

A second example involves portion 30 of path 20, and portion 32 of path 22. Here, if region 34 is a trace on an upper layer (isolated from the lower layer by a dielectric) which connects path 20 and 22 at contact points 36 and 38 respectively, defect 26 will be a nonfatal defect. However, if region 34 was not there, defect 26 would, in this second example, be fatal. This is because path 20 and 22 are not designed to be connected, but the unintentional conductive defect 26 has connected them. Thus, whether a defect causes a fault depends not only on the size and location of the defect, but also on its conductivity and upon the connectivity of the traces that are potentially affected.

Integrated circuits (IC's) are comprised of multiple layers of different materials, with each layer interacting with other layers in various ways depending on the materials involved. Typically, an IC that results from a manufacturing and packaging process began as a blank silicon wafer regions of which have been suitably doped and, upon which layers of metal, dielectric, and perhaps other materials have been formed. Patterns on a wafer are typically formed by applying a layer of a desired material, upon which a photosensitive material (photoresist) is applied. The photosensitive material on the wafer is then selectively exposed to a high intensity ultraviolet (UV) light from a mercury arc lamp, a laser, or other similar source through a mask, and then developed in a chemical to remove the photosensitive material from areas on the wafer which were not exposed to the UV light. Chemicals in a liquid solution or gaseous plasma are then employed to selectively remove material from regions not covered by photoresist, while regions covered by photoresist are protected and thus remain intact. Finally, the photoresist is removed. This process is carried out repeatedly to build up the electronic circuits on the wafer. A single wafer comprises many dice, and each functional die eventually is cut from the wafer and packaged for use as an IC in an electronic device.

The photosensitive material used in the lithography process is an organic polymer that is referred to as photoresist. In order to form very small features in the photoresist having close registration with features that have been formed in previous operations, it is common practice to expose only a small portion or "field" of the photoresist-covered wafer through a mask or stencil, expose a second field offset from the first, repeating the exposing process for all fields on the wafer. This process is referred to as "stepping" the mask image across the wafer. One field may contain several die.

Prior art wafer manufacturing operations are typically performed on each die section of each wafer, proceeding until each die on a given wafer has received identical or nearly identical processing treatment. Although suitable for its intended purpose, the prior art fails to maximize throughput of manufacturing equipment in cases where further processing on a die containing fatal defects would be useless. It would therefore be beneficial to provide a method for intelligently using defect data in the manufacturing process to eliminate from further processing those die location which contain defects which are determined to be fatal.

OBJECTS AND ADVANTAGES OF THE INVENTION

It is an object and advantage of the present invention to provide a method for intelligently using defect data to selectively control manufacturing processing on a wafer.

It is a further object and advantage of the present invention to provide a method for analyzing the effect of an identified defect on the acceptability of a die which utilizes historical test data and historical inspection data to determine a probability that a given defect will result in a test failure.

SUMMARY OF THE INVENTION

After a processing step such as an etching step known to those of ordinary skill in the art the processed wafer, is presented for inspection, and one or more defects on the wafer are detected during that inspection. Data relating to detected defects is used to determine the likelihood that any given defect will result in an electrical failure. If the probability exceeds a predetermined threshold, the die containing the defect is flagged as rejected. If, at any time during the manufacturing cycle, all die within a field have been rejected, the field is flagged, thus removing it from further processing, and minimizing the time spent processing fields that will not result in useful product. Because the stepper equipment now ignores the flagged field, valuable processing time which would otherwise be wasted while processing and inspecting defective product can be saved.

DESCRIPTION OF A PREFERRED EMBODIMENT

Those of ordinary skill in the art will realize that the following description of the present invention is illustrative only and is not intended to be in any way limiting. Other embodiments of the invention will readily suggest themselves to such skilled persons from an examination of the within disclosure.

Figure 3:
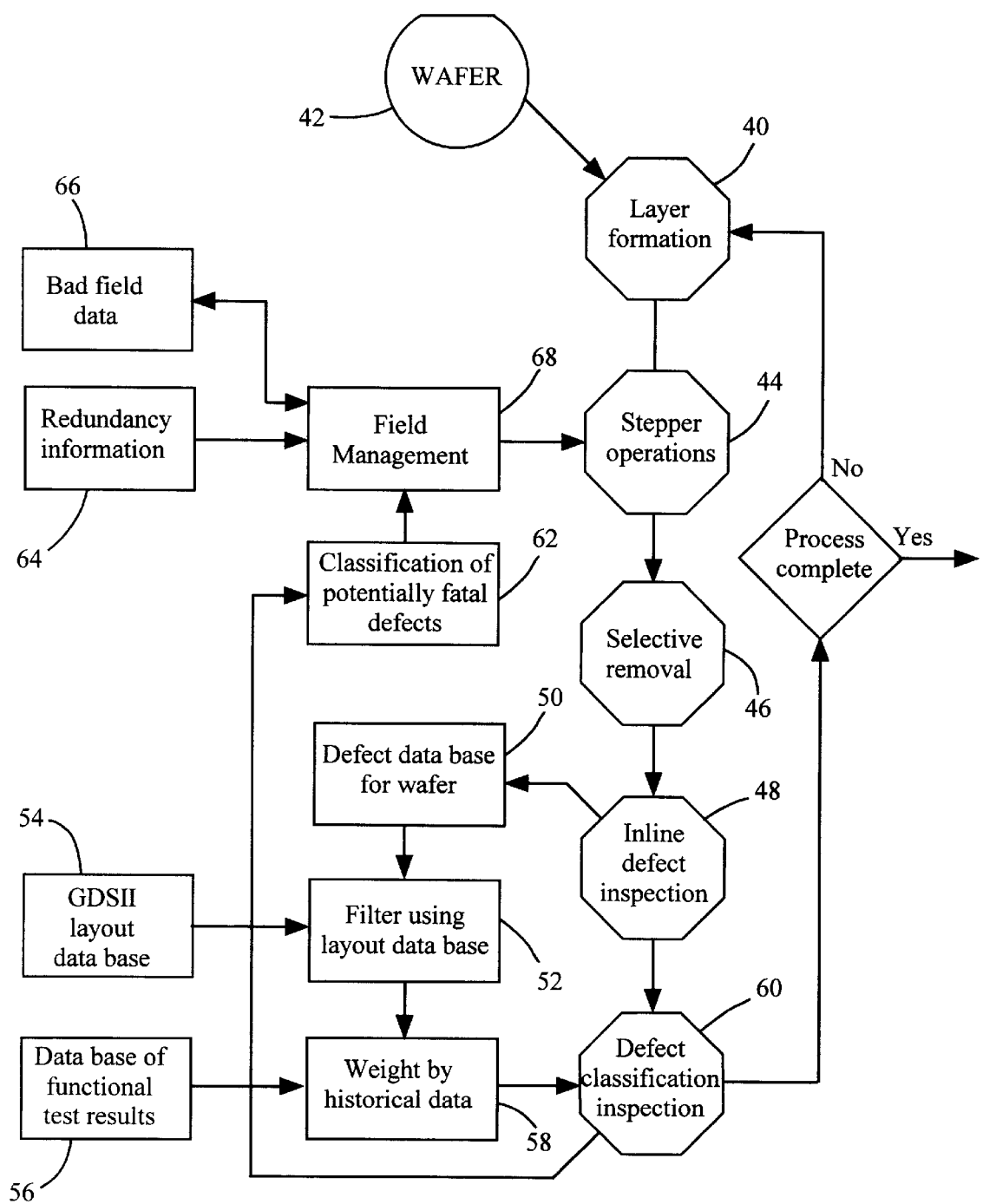
FIG. 3 is a flowchart depicting a preferred method of the present invention.

FIG. 3 is a flowchart depicting a preferred method of the present invention.

Referring to FIG. 3, a preferred method of the present invention begins at step 40 where a metal layer, a dielectric, layer, an epitaxial layer, or other desired layer of material is deposited on a silicon wafer 42. For the purposes of this discussion, it will be assumed that the layer deposited was aluminum metal. At stepper operations 44, photoresist is applied over the layer previously deposited at step 40. The photosensitive material on the wafer is then selectively exposed to a high intensity Ultraviolet (UV) light from a mercury arc lamp, a laser, or other similar source through a mask. This operation involves "stepping" the mask over the surface of the wafer, thus exposing many fields on the wafer, with each field containing patterns for an integral number of dice. The exposed areas of the wafer are "developed" in a chemical which removes the photoresist from areas on the wafer which were exposed to the UV light.

At etching step 46, chemicals in a liquid solution or gaseous plasma are then employed to selectively remove material (deposited in step 40) from regions not covered by photoresist, while regions covered by photoresist are protected and thus remain intact. Following the etching, still in step 46, remaining photoresist is removed from the wafer.

Because the manufacturing process is not perfect, foreign material such as dust on a mask might cause a faulty exposure of the photoresist, causing undesired metal to remain on the wafer. This undesired metal is a defect.

Foreign material is one of many reasons a defect may be created on a wafer. Although the cause of a defect is important when determining how to improve production yields, the cause of a defect is not as important to the practice of the invention as are the discovery of the defect and the analysis of whether the defect is fatal to the circuitry being created on the wafer.

A mask is typically the size of one or more dice on a wafer, with 200 or more dice on each wafer being typical. For example, a 16 MBit memory array is one die. Two hundred such dice may be designed on a single silicon wafer. Further, the circuitry may be small enough in wafer area that two dice may make up one mask field. Since, in the present example, 200 dice are designed to be on the wafer, and two dice make up one field, 100 exposure operations are required each time the wafer undergoes the photoetching process for each layer. If there are twenty layers on the wafer, 2000 exposure operations are required to fully process the wafer. The number of dice on a wafer and the number of dice within each field may vary without departing from the scope or purpose of the present invention.

Following selective removal step 46, in-line inspection step 48 takes place, and then data corresponding to detected defects is stored, at step 50, in a database. At step 52, the defect database is filtered to isolate data pertaining to the particular die being analyzed. The defect data is then analyzed with connectivity information from GDSII layout data base 54.

Figure 1:
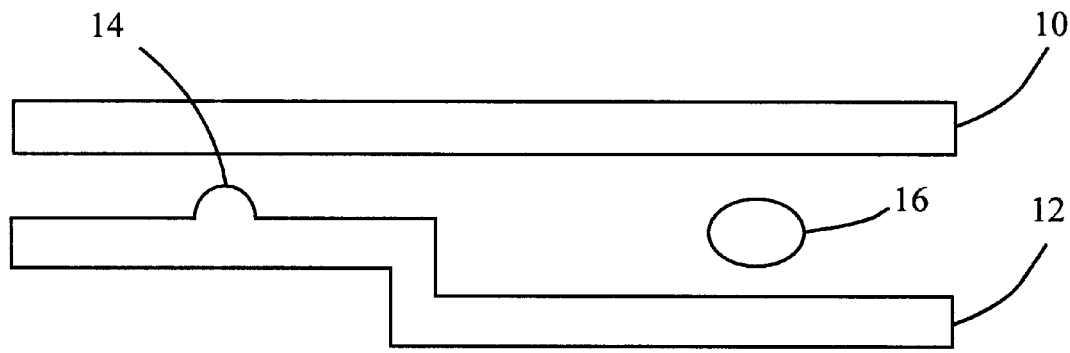
FIG. 1 is a layout diagram of typical defects which will not result in an electrical failure.
Figure 2:
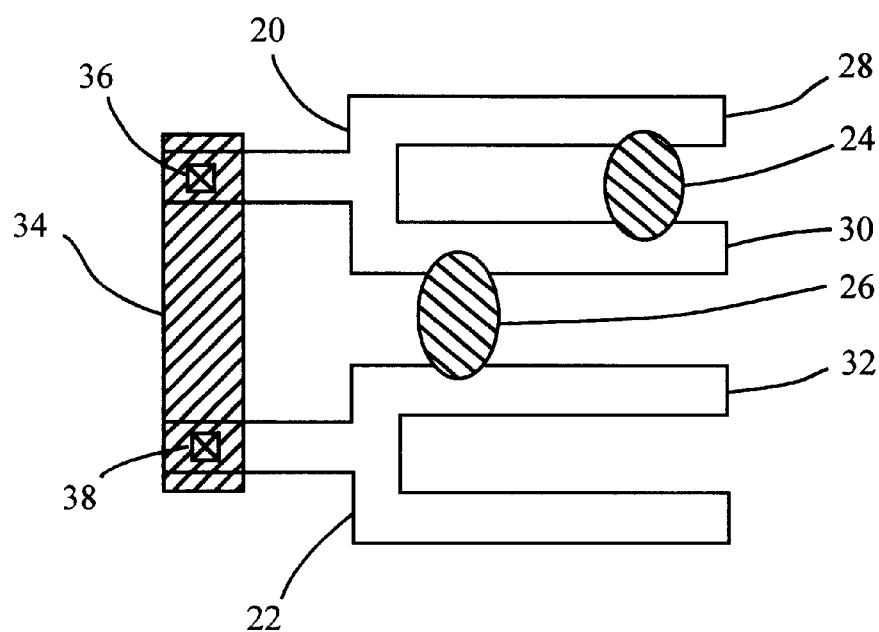
FIG. 2 is a layout diagram depicting defects which cause bridging between traces.

Note that an algorithm that merely classifies all bridging defects as causing electrical faults will falsely identify defect 24 of FIG. 2 as a fatal defect. An algorithm that eliminates defects that connect portions of the same conducting trace is also insufficient because it would falsely identify defect 26 of FIG. 2 (under the scenario wherein region 34 was designed to connect traces 20 and 22) as a fatal defect. To properly analyze whether a defect is fatal, it is necessary to utilize the entire connectivity of each die so that all traces that form a common electrical node can be identified. This operation is called net extraction.

There are at least three strategies that can be employed for net extraction. The first strategy is to perform a global extraction, i.e. to extract the connectivity for the entire integrated circuit, before any other analysis is done, and store the resultant net for later use. In this first strategy, the wafer definition file is processed to extract all nets by reading in a net list file such as a SPICE file or by direct extraction from within the layout database. The extraction of all nets results in a connectivity graph of the design. This first strategy can take a lot of computer time for a large circuit, but may be preferred in those cases In which it is expected that the resultant net will be employed extensively over an extended period of time so that the initial time expenditure can be amortized over many analyses.

A second similar strategy, called local net extraction, is to perform a number of extractions over the individual circuit subsections, for example the ALU and data cache in a processor or the individual subarrays in a memory. This second strategy has two advantages over the first. The first advantage is that the extraction time increases quadratically with the number of nodes. Thus, with fewer nodes to extract, the extraction time is decreased. The second advantage is seen when using repeated functional blocks as in the sixteen memory subarrays described earlier, where knowledge of the connectivity of one functional block may be used to reduce the time to extract other identical arrays. The disadvantage of this second strategy, however, is the difficulty of keeping track of the connectivity across the boundaries where the individual subarrays meet.

A third strategy, developed by the inventors and termed dynamic extraction, uses the identified defects as a guide to what information needs to be extracted from the wafer definition file. When a defect is identified as possibly affecting a particular geometry on the circuit, the connectivity of that particular geometry is extracted for one time use during the time that a particular defect is being analyzed. This third strategy is preferred in cases in which any circuit is expected to be analyzed over a limited amount of time as is often the case in the manufacture of application specific integrated circuits.

Once the connectivity has been found using any of the three strategies described above or any other reasonable approach, the likelihood of an identified defect altering this connectivity graph is determined using the defect's location and size information. If the likelihood is high, but not determinative, that one or more fatal defects have been detected, historical test data 56 is consulted at step 58 to determine if defects located at inspection step 48 for this particular layer in a similar location has led to circuit failure on previously processed dice. If no historical test data relating to that defect is available, or if the connectivity analysis was determinative on its own, the results from step 52 are used to determine whether further inspection of the defect is necessary.

If, in step 50 or in step 52 it is determined that one or more suspected fatal defects exist, these defects may be further analyzed and inspected at defect classification step 60. At this step, defect classification equipment such as an in-line scanning electron microscope (SEM) might be used with an electron dispersive x-ray (EDX) attachment. Images generated by the defect classification inspection can be analyzed off-line at step 62. This off-line analysis allows the specialized in-line equipment to operate at full speed. For example, an inspection SEM is capable of operating at greater than 200 images per hour. By using the information from GDSII layout data base 54 and the historical test data 56, however, the number of defects to be imaged at step 60 may be reduced in number so that the throughput of the defect classification equipment can be greater than 60 wafers per hour. Thus, by combining the use of connectivity information and historical data with the use of SEM and other specialized equipment, it is feasible to classify all potentially fatal defects. GDSII files are weell known to those of ordinary skill in the art.

Using all of the information developed from all of the sources previously discussed, defects that are extremely likely to be fatal are now known. On some devices, one fatal defect means that the die containing the defect will not meet specification and thus will be rejected. For other devices, such as memory arrays, redundancy can be used to repair some array defects. Using redundancy information 64, it can be determined whether a particular fatal defect is repairable.

Redundancy is a technique by which extra rows or columns in memories are substituted for defective ones in order to improve yield. It is a common and effective technique known to those of ordinary skill in the art which can increase the yield of shippable dice.

Briefly, the technique for static and dynamic random access memories usually employs a laser that cuts a polysilicon fuse to substitute a replacement row or column for a defective one. For nonvolatile memory, it is common to use the nonvolatile elements inherent in the process in order to implement the redundancy fuses. Redundancy repair is typically performed at the end of the manufacturing process after all of the connections to the memory are made and the device is tested to identify which rows or columns are defective or whether there is a global defect (e.g. a defect in a circuit that affects the entire chip such as a chip enable circuit) that will cause the entire chip to fail.

In the context of the current invention, the redundancy information 64 is checked, within the manufacturing process for memory circuits or other circuits where using redundancy information is feasible, to determine whether a defect is expected to be repairable. If an otherwise fatal defect is likely to be repairable, this expectation can be recorded and processing of the chip continued until the number of defective rows or columns exceeds the number of redundant rows or columns available for repair, at which time the memory array involved will be flagged as fatally defective.

If a fatal defect is not repairable, the die on which the defect appears is flagged as rejected. Identification data relating to failing dice is recorded and cumulated each time inspections occur. Once all of the dice in a given field of stepper operations have been identified as failed, the field is removed from further processing operations, and the information relating to that field is stored in bad field data 66 at field management step 68. On many advanced devices, such as high density memories and microprocessors, dice are often so large that only one die will fit into a stepper field.

Consider a high-end microprocessor with a five level metal process. Suppose that the yield of good die from a typical wafer is 80% and that, on the average, fatal defects are detected approximately halfway through the manufacturing process. In this case, stepper operations could be omitted on one-half of the process loops for twenty percent of the fields to be stepped, without decreasing the yield of good dice. Thus, the throughput of the stepper equipment may be increased ten percent with the use of the method of the present invention.

At some point in the manufacturing process for a wafer, the last required layer of material will have been applied (and etched, if required). After this step, there may be no further stepper operations to take place. However, an inline inspection might be performed so that potential defects resulting from the final processing operations may be detected. Following the analysis of any potentially fatal defects on this final layer, the method of the present invention terminates.

An alternative contemplated by the inventors is to eliminate fields from further processing that had enough failing dice to push the yield for that field below some minimum acceptable percentage. The percentage is determined from such factors as the quantity of wafers being manufactured in a given time period, the price of the finished product, and the research and development costs associated with the design.

It will be readily seen by those of ordinary skill in the art that the method of the present invention may be used to eliminate any type of repetitive operation from being performed on any given section of the wafer determined to have fatal defects. For instance, in addition to removing a fatally defective field from stepper operations 44, that same fatally defective field may be removed from further inspection processing, test operations, or any other repetitive operation normally performed on each field defined on a wafer being processed. Also, stepper operations as described herein related to UV photolithography. However, it is contemplated by the inventors that the present invention may be applied to manufacturing processes which use e-beam, ion beam, XRAY, or other photolithography techniques.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A method for manufacturing a plurality of integrated circuit die on a wafer in a wafer fabrication process including a plurality of fabrication steps, comprising:

performing at least one fabrication step on a wafer using the wafer fabrication process;

inspecting each die on said wafer and identifying each actual fatal defect found thereon after performing at least one fabrication step; and performing at least one additional fabrication step on said wafer using said wafer fabrication process in which each die having a fatal defect is not processed.

2. A method for manufacturing a plurality of integrated circuit die on a wafer in a wafer fabrication process including a plurality of fabrication steps, comprising:

providing a database containing information defining the intended circuit topology for the integrated circuit die and identifying a plurality of characterized defects experientially encountered for said integrated circuit die and for each one of said characterized defects assigning a probability that it will be a fatal defect altering said intended circuit topology;

performing at least one fabrication step on a wafer using the wafer fabrication process;

inspecting each die on said wafer and identifying each actual defect found thereon after performing at least one fabrication step;

assigning to said each actual defect identified a fatality probability based on information in said database and a set of inspection parameters;

identifying each die having a fatality probability greater than a threshold value as a defective die; and performing at least one additional fabrication step on said wafer using said wafer fabrication process in which each defective die is not processed.

3. The method of claim 2 wherein assigning a fatality probability is further defined as including:

dynamically extracting net list information for at least one circuit relating to a defect being analyzed; and determining at least one conductive path likely to be impaired by the at least one known defect.

4. The method of claim 2 further including:

compiling historical test data relating to defect attributes on at least one circuit on a number of die from at least one wafer; and wherein said assigning a fatality probability includes performing an analysis of said historical test data when assigning a fatality probability.

5. The method of claim 2 further including:

compiling historical inspection data relating to defect attributes on at least one circuit on a number of die from at least one wafer; and wherein said assigning a fatality probability includes performing an analysis of said historical inspection data when assigning a fatality probability.

6. The method of claim 2 further including:

compiling historical test data relating to at least one defect attribute on a second plurality of subregions on at least one wafer; and compiling historical inspection data relating to at least one defect attribute on a second plurality of subregions on at least one wafer; and wherein said assigning a fatality probability includes an analysis of said historical inspection data and an analysis of said historical test data when assigning a fatality probability.

7. A method for manufacturing a plurality of integrated circuits on a wafer in a wafer fabrication process including a plurality of fabrication steps performed by a stepper on frames defined on the wafer, each frame including a plurality of integrated circuit die, the method comprising:

performing at least one fabrication step on a wafer using the stepper in the wafer fabrication process;

inspecting each die on said wafer and identifying each actual fatal defect found thereon after performing at least one fabrication step; and identifying each frame on said wafer containing a threshold number of die having a fatal defect greater than a threshold number as a defective frame;

performing at least one additional fabrication step on said wafer using said stepper in said wafer fabrication process in which each defective frame is not processed.

8. A method for manufacturing a plurality of integrated circuits on a wafer in a wafer fabrication process including a plurality of fabrication steps performed by a stepper on frames defined on the wafer, each frame including a plurality of integrated circuit die, the method comprising:

providing a database containing information defining the intended circuit topology for the integrated circuit die and identifying a plurality of characterized defects experientially encountered for said integrated circuit die and for each one of said characterized defects assigning a probability that it will be a fatal defect altering said intended circuit topology;

performing at least one fabrication step on a wafer using stepper in the wafer fabrication process;

inspecting each die on said wafer and identifying each actual defect found thereon after performing at least one fabrication step;

assigning to said each actual defect identified a fatality probability based on information in said database and a set of inspection parameters;

identifying each frame on said wafer containing a threshold number of die having fatality probabilities greater than a threshold value as a defective frame;

performing at least one additional fabrication step on said wafer using said stepper in said wafer fabrication process in which each defective frame is not processed.

9. The method of claim 8 wherein assigning a fatality probability is further defined as including:

dynamically extracting net list information for at least one circuit relating to a defect being analyzed; and determining at least one conductive path likely to be impaired by the at least one known defect.

10. The method of claim 8 wherein assigning a fatality probability is further defined as including:

dynamically extracting net list information for at least one circuit relating to a defect being analyzed; and determining at least one conductive path likely to be impaired by the at least one known defect.

11. The method of claim 8 further including:

compiling historical test data relating to defect attributes on at least one circuit on a number of die from at least one wafer; and wherein said assigning a fatality probability includes performing an analysis of said historical test data when assigning a fatality probability.

12. The method of claim 8 further including:

compiling historical inspection data relating to defect attributes on at least one circuit on a number of die from at least one wafer; and wherein said assigning a fatality probability includes performing an analysis of said historical inspection data when assigning a fatality probability.

13. The method of claim 8 further including:

compiling historical test data relating to at least one defect attribute on at least one circuit on at least one wafer;

compiling historical inspection data relating to at least one defect attribute on said at least one circuit on at least one wafer; and wherein said assigning a fatality probability includes an analysis of said historical inspection data and an analysis of said historical test data when assigning a fatality probability.

* * * * *